United States Patent
Chiang et al.

(10) Patent No.: US 10,438,851 B2
(45) Date of Patent: Oct. 8, 2019

(54) THRESHOLD VOLTAGE ADJUSTMENT FOR A GATE-ALL-AROUND SEMICONDUCTOR STRUCTURE

(71) Applicant: Taiwan Semiconductor Manufacturing Co., Ltd., Hsinchu (TW)

(72) Inventors: Hung-Li Chiang, Taipei (TW); Szu-Wei Huang, Hsinchu (TW); Huan-Sheng Wei, Taipei (TW); Jon-Hsu Ho, New Taipei (TW); Chih Chieh Yeh, Taipei (TW); Wen-Hsing Hsieh, Hsinchu (TW); Chung-Cheng Wu, Hsin-Chu County (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/048,581

(22) Filed: Jul. 30, 2018

(65) Prior Publication Data

US 2018/0337094 A1 Nov. 22, 2018

Related U.S. Application Data

(62) Division of application No. 15/666,715, filed on Aug. 2, 2017.

(51) Int. Cl.
*H01L 21/8234* (2006.01)
*H01L 21/02* (2006.01)
(Continued)

(52) U.S. Cl.
CPC ......... *H01L 21/823412* (2013.01); *H01L 21/02236* (2013.01); *H01L 21/02532* (2013.01);
(Continued)

(58) Field of Classification Search
CPC .......... H01L 21/823412; H01L 27/088; H01L 21/02532; H01L 21/02603;
(Continued)

(56) References Cited

U.S. PATENT DOCUMENTS 7,425,740 B2 9/2008 Liu et al.
7,667,271 B2 2/2010 Yu et al.
(Continued)

FOREIGN PATENT DOCUMENTS

TW 201622014 A 6/2016

*Primary Examiner* — Syed I Gheyas
(74) *Attorney, Agent, or Firm* — Haynes and Boone, LLP

(57) ABSTRACT

A semiconductor structure includes a plurality of first semiconductor layers interleaved with a plurality of second semiconductor layers. The first and second semiconductor layers have different material compositions. A dummy gate stack is formed over an uppermost first semiconductor layer. A first etching process is performed to remove portions of the second semiconductor layer that are not disposed below the dummy gate stack, thereby forming a plurality of voids. The first etching process has an etching selectivity between the first semiconductor layer and the second semiconductor layer. Thereafter, a second etching process is performed to enlarge the voids.

20 Claims, 12 Drawing Sheets

Related U.S. Application Data

(60) Provisional application No. 62/427,402, filed on Nov. 29, 2016.

(51) Int. Cl.
   *H01L 21/306* (2006.01)
   *H01L 27/088* (2006.01)
   *H01L 29/06* (2006.01)
   *H01L 29/423* (2006.01)
   *H01L 29/66* (2006.01)
   *H01L 29/786* (2006.01)
   *H01L 21/28* (2006.01)
   *H01L 29/49* (2006.01)

(52) U.S. Cl.
   CPC .. *H01L 21/02603* (2013.01); *H01L 21/28123* (2013.01); *H01L 21/30604* (2013.01); *H01L 21/823456* (2013.01); *H01L 27/088* (2013.01); *H01L 29/0673* (2013.01); *H01L 29/42392* (2013.01); *H01L 29/4966* (2013.01); *H01L 29/66545* (2013.01); *H01L 29/78618* (2013.01); *H01L 29/78651* (2013.01); *H01L 29/78696* (2013.01)

(58) Field of Classification Search
   CPC ......... H01L 21/30604; H01L 29/78696; H01L 29/0673; H01L 29/42392; H01L 29/66545; H01L 21/02236; H01L 29/78651
   See application file for complete search history.

(56) References Cited

U.S. PATENT DOCUMENTS

| | | |
|---|---|---|
| 7,910,453 B2 | 3/2011 | Xu et al. |
| 8,048,723 B2 | 11/2011 | Chang et al. |
| 8,053,299 B2 | 11/2011 | Xu |
| 8,183,627 B2 | 5/2012 | Currie |
| 8,362,575 B2 | 1/2013 | Kwok et al. |
| 8,367,498 B2 | 2/2013 | Chang et al. |
| 8,377,779 B1 | 2/2013 | Wang |
| 8,399,931 B2 | 3/2013 | Liaw et al. |
| 8,415,718 B2 | 4/2013 | Xu |
| 8,440,517 B2 | 5/2013 | Lin et al. |
| 8,487,378 B2 | 7/2013 | Goto et al. |
| 8,497,177 B1 | 7/2013 | Chang et al. |
| 8,497,528 B2 | 7/2013 | Lee et al. |
| 8,609,518 B2 | 12/2013 | Wann et al. |
| 8,610,240 B2 | 12/2013 | Lee et al. |
| 8,618,556 B2 | 12/2013 | Wu et al. |
| 8,633,516 B1 | 1/2014 | Wu et al. |
| 8,652,894 B2 | 2/2014 | Lin et al. |
| 8,680,576 B2 | 3/2014 | Ching et al. |
| 8,686,516 B2 | 4/2014 | Chen et al. |
| 8,703,565 B2 | 4/2014 | Chang et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,735,993 B2 | 5/2014 | Lo et al. |
| 8,736,056 B2 | 5/2014 | Lee et al. |
| 8,742,509 B2 | 6/2014 | Lee et al. |
| 8,772,109 B2 | 7/2014 | Colinge |
| 8,776,734 B1 | 7/2014 | Roy et al. |
| 8,785,285 B2 | 7/2014 | Tsai et al. |
| 8,796,666 B1 | 8/2014 | Huang et al. |
| 8,796,759 B2 | 8/2014 | Perng et al. |
| 8,809,139 B2 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,826,213 B1 | 9/2014 | Ho et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,887,106 B2 | 11/2014 | Ho et al. |
| 9,105,490 B2 | 8/2015 | Wang et al. |
| 2005/0285201 A1 | 12/2005 | Tran |
| 2011/0068407 A1 | 3/2011 | Yeh et al. |
| 2013/0011983 A1 | 1/2013 | Tsai et al. |
| 2013/0285153 A1 | 10/2013 | Lee et al. |
| 2013/0341704 A1 | 12/2013 | Rachmady et al. |
| 2014/0001441 A1 | 1/2014 | Kim et al. |
| 2014/0001574 A1 | 1/2014 | Chen et al. |
| 2014/0110755 A1 | 4/2014 | Colinge |
| 2014/0151638 A1 | 6/2014 | Chang et al. |
| 2014/0151812 A1 | 6/2014 | Liaw |
| 2014/0183600 A1 | 7/2014 | Huang et al. |
| 2014/0252412 A1 | 9/2014 | Tsai et al. |
| 2014/0264590 A1 | 9/2014 | Yu et al. |
| 2014/0264592 A1 | 9/2014 | Oxland et al. |
| 2014/0282326 A1 | 9/2014 | Chen et al. |
| 2015/0053928 A1* | 2/2015 | Ching ............ H01L 21/823821 257/29 |
| 2015/0263003 A1 | 9/2015 | Lee et al. |
| 2016/0027929 A1* | 1/2016 | Cheng ............... H01L 29/78696 257/9 |
| 2016/0315153 A1 | 10/2016 | Then et al. |
| 2017/0221708 A1 | 8/2017 | Bergendahl et al. |
| 2018/0122901 A1* | 5/2018 | Kim .................... H01L 29/0673 |
| 2018/0277682 A1* | 9/2018 | Zhu .................... H01L 29/0692 |

\* cited by examiner

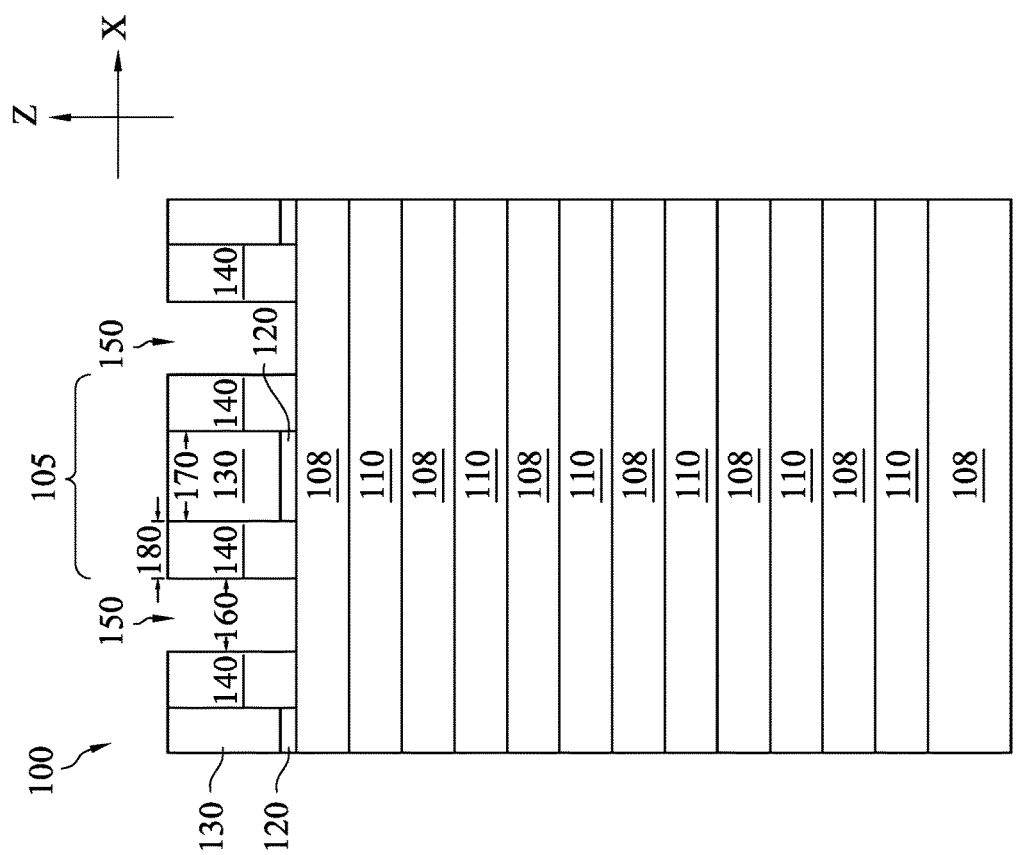
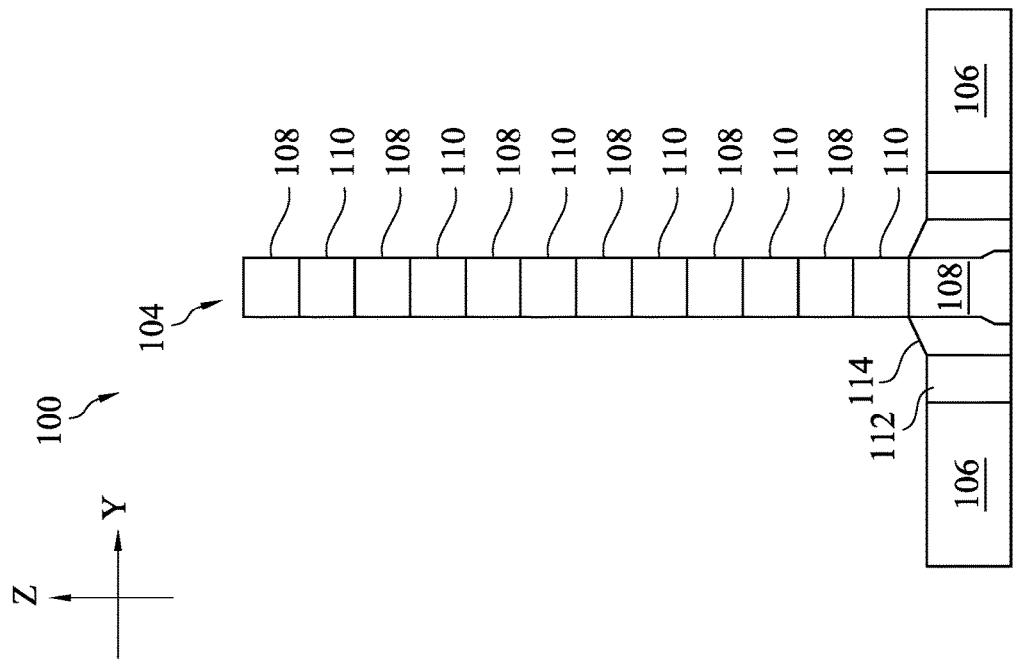

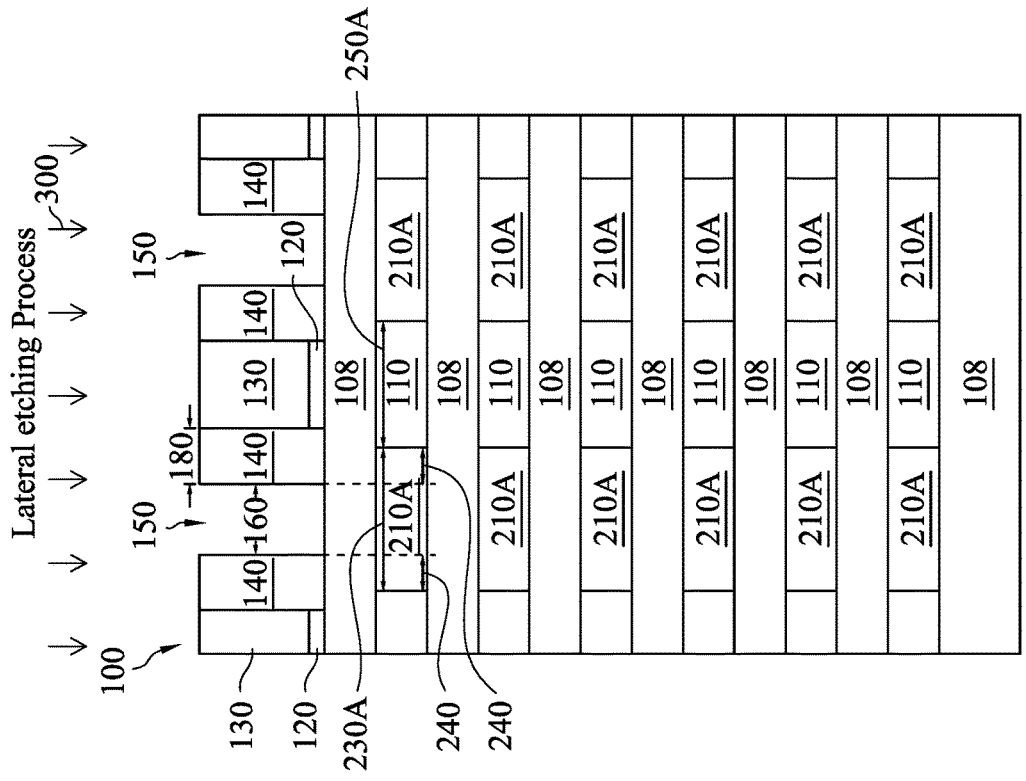
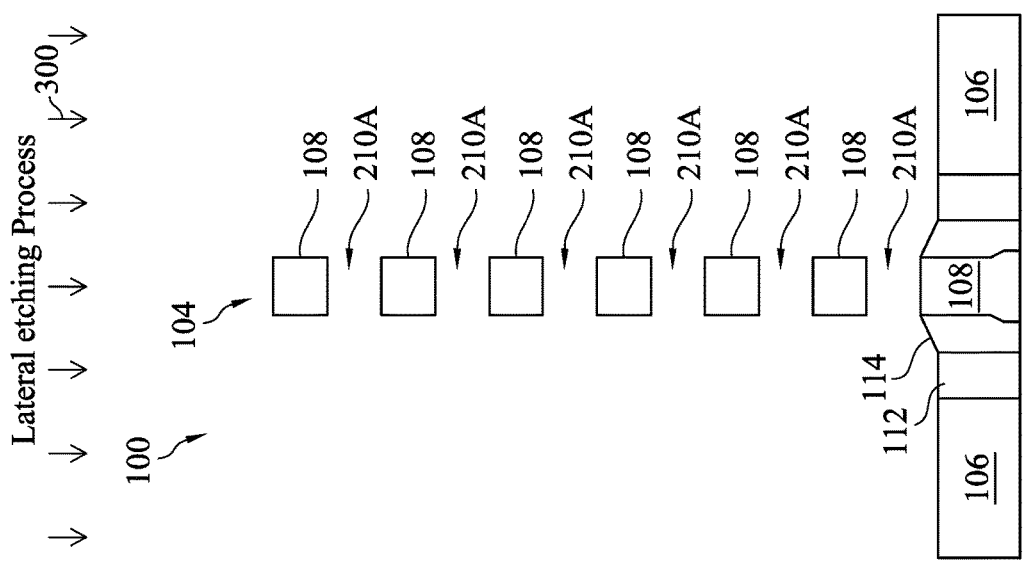

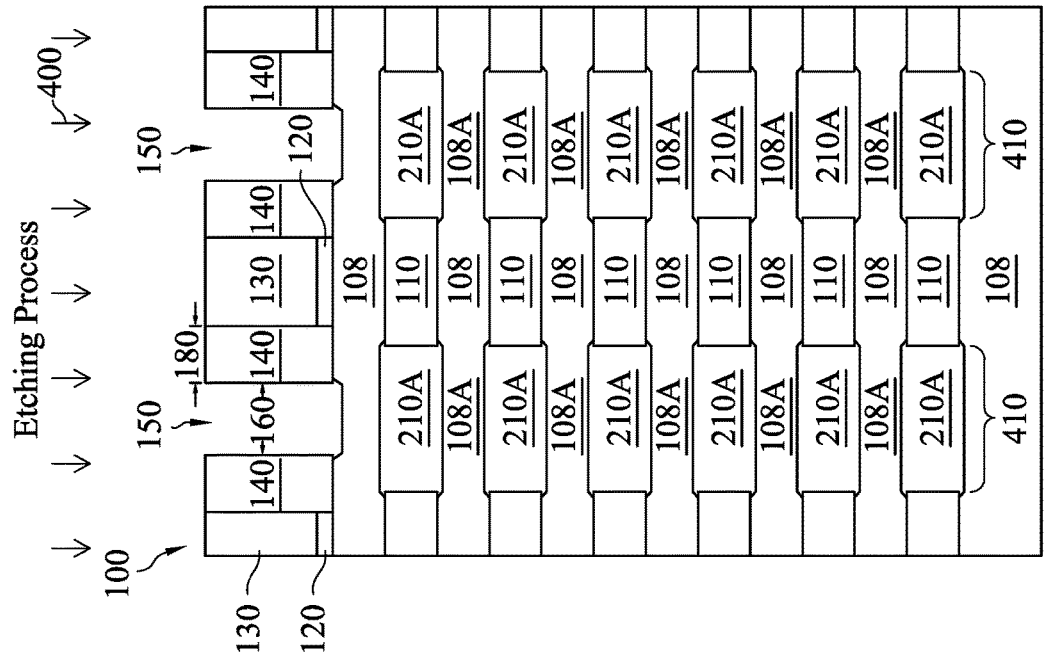
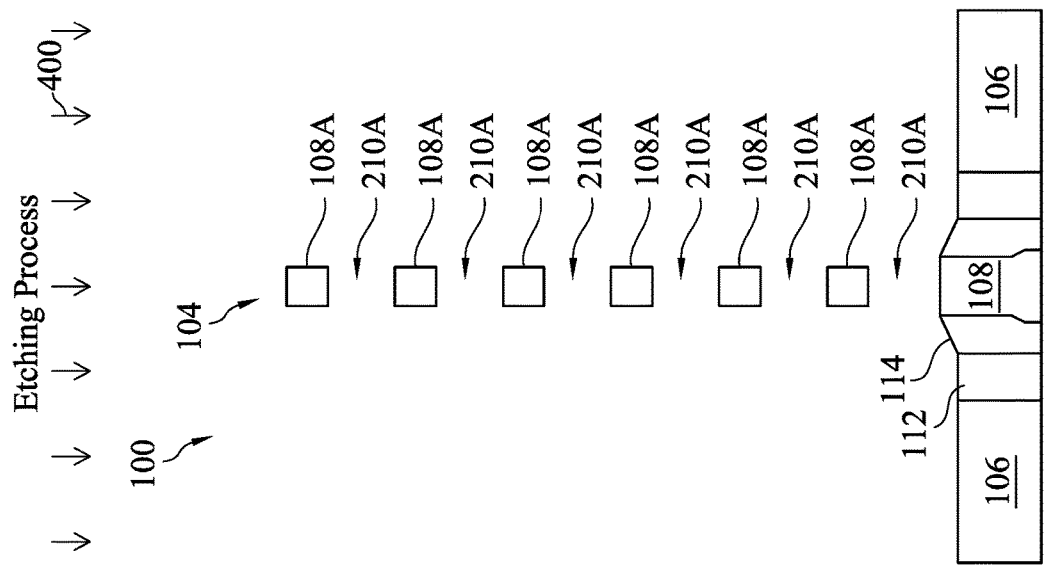
Fig. 4B
Fig. 4A

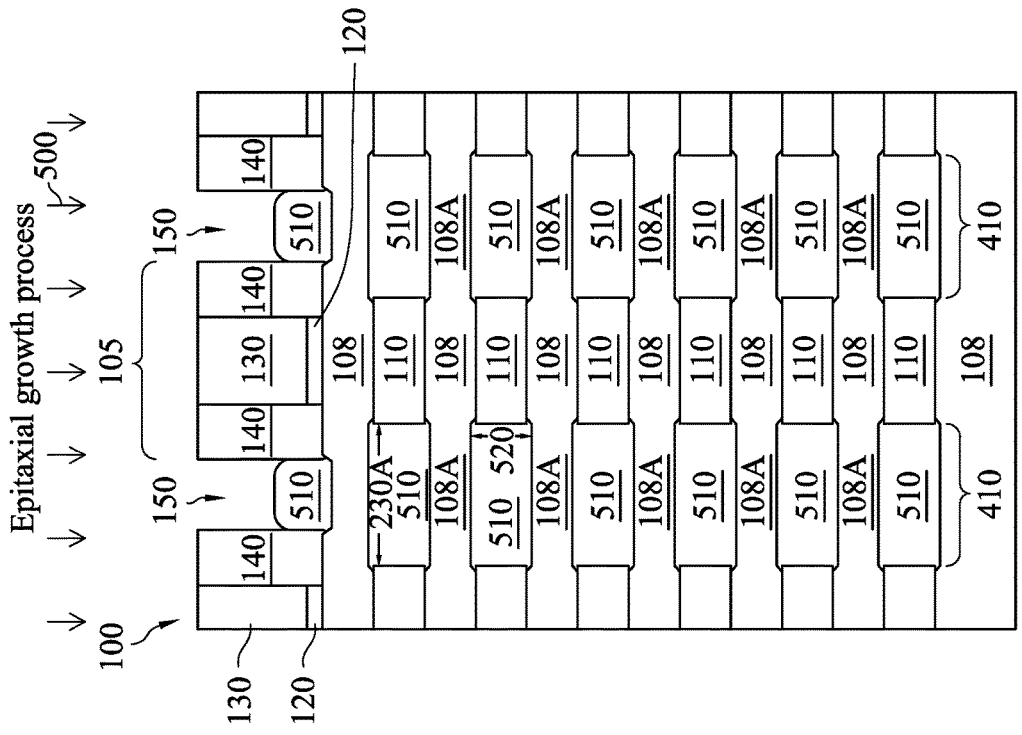
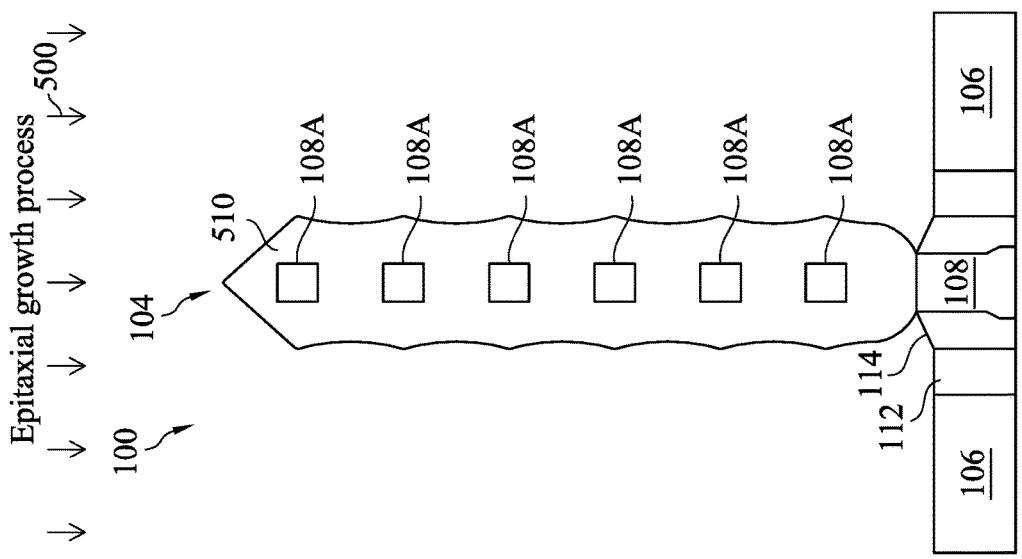
Fig. 5B
Fig. 5A

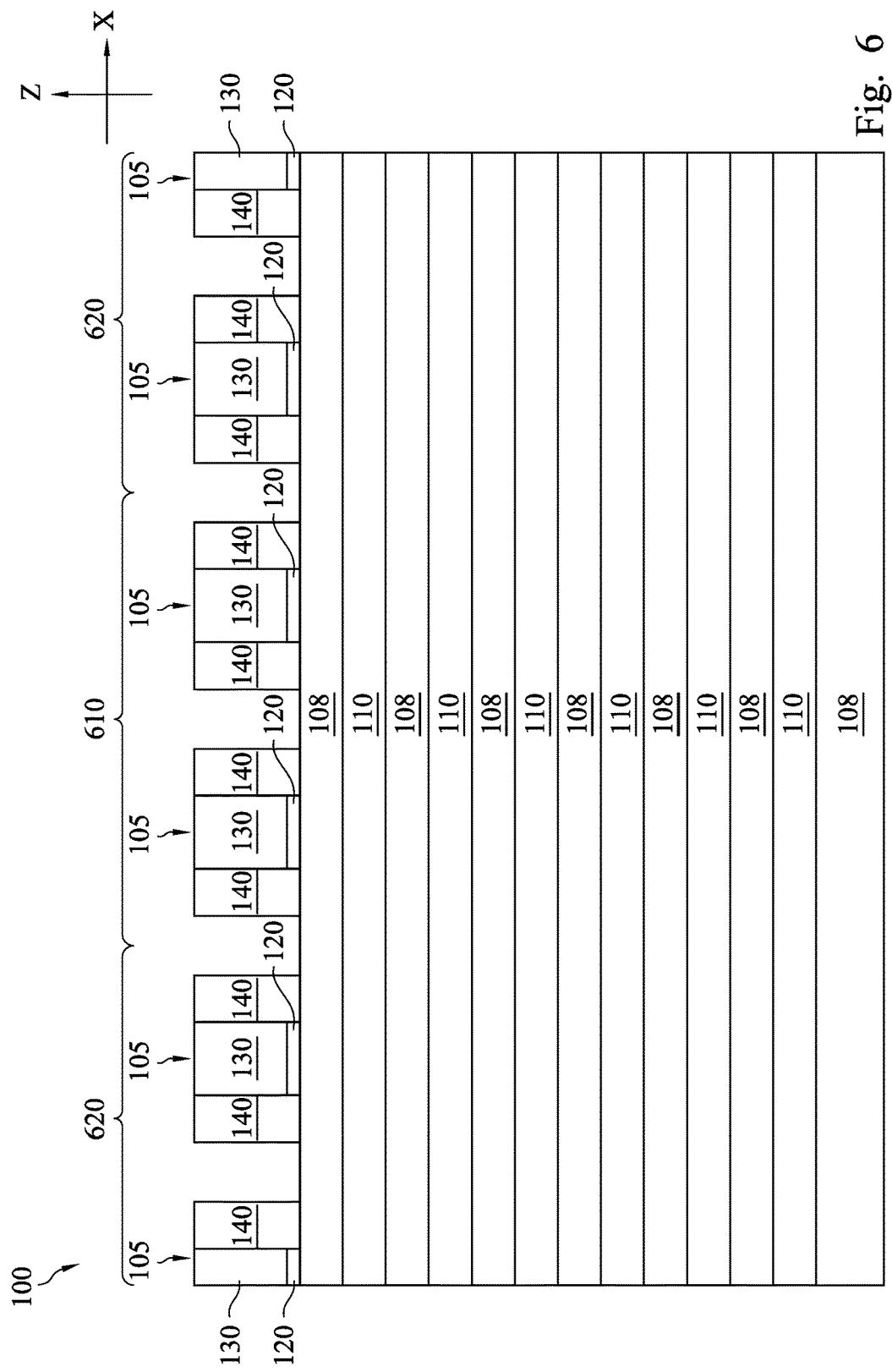

THRESHOLD VOLTAGE ADJUSTMENT FOR A GATE-ALL-AROUND SEMICONDUCTOR STRUCTURE

PRIORITY DATA

This application is a divisional of U.S. application Ser. No. 15/666,715, filed Aug. 2, 2017 which is utility application of provisional U.S. patent application 62/427,402 filed on Nov. 29, 2016, entitled "Methods For Threshold Voltage Adjustment of Sub-5 nm Transistors", the disclosures of which are hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is horizontal gate-all-around (HGAA) transistor, whose gate structure extends around its horizontal channel region providing access to the channel region on all sides. The HGAA transistors are compatible with conventional complementary metal-oxide-semiconductor (CMOS) processes, allowing them to be aggressively scaled down while maintaining gate control and mitigating SCEs. However, it is difficult for conventional HGAA devices to control its threshold voltage (Vt), due to issues such as smaller depletion region and smaller channel volume, and mobility degradation induced by heavy doping.

Therefore, although conventional HGAA devices have been generally adequate for their intended purposes, they are not satisfactory in every respect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A-5A are cross-sectional side views of a semiconductor structure at various stages of fabrication according to various aspects of the present disclosure.

FIGS. 1B-5B are cross-sectional side views of a semiconductor structure at various stages of fabrication according to various aspects of the present disclosure.

FIGS. 6-11 are cross-sectional side views of a semiconductor structure at various stages of fabrication according to various aspects of the present disclosure.

DETAILED DESCRIPTION

Figure 2B:
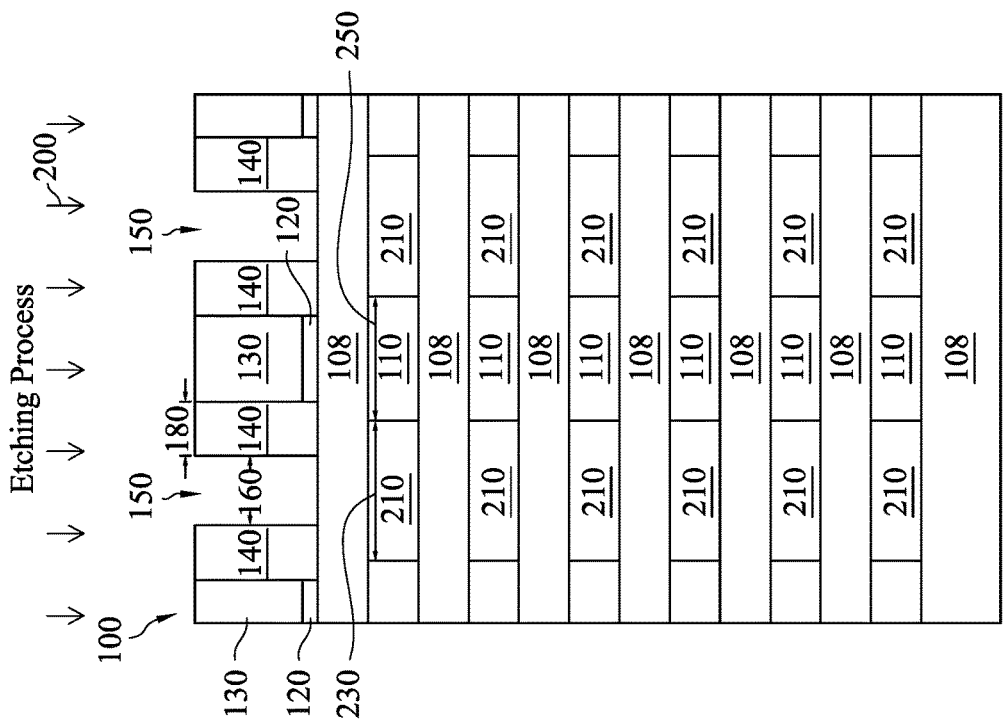

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. More particularly, the present disclosure is related to gate-all-around (GAA) devices. A GAA device includes any device that has its gate structure, or portions thereof, formed on four-sides of a channel region (e.g., surrounding a portion of a channel region). The channel region of a GAA device may include nanowire channels, bar-shaped channels, and/or other suitable channel configurations. In embodiments, the channel region of a GAA device may have multiple horizontal nanowires or horizontal bars vertically spaced, making the GAA device a stacked horizontal GAA (S-HGAA) device. The GAA devices presented herein may include p-type metal-oxide-semiconductor GAA devices or n-type metal-oxide-semiconductor GAA devices. Further, the GAA devices may have one or more channel regions (e.g., nanowires) associated with a single, contiguous gate structure, or multiple gate structures. One of ordinary skill may recognize other examples of semiconductor devices that may benefit from aspects of the present disclosure.

FIGS. 1A-5A and 1B-5B illustrate different cross-sectional side views of a semiconductor structure 100 at various stages of fabrication according to embodiments of the present disclosure. Specifically, FIGS. 1A-5A illustrate cross-sectional views taken along a Y-direction of the semiconductor structure 100, and FIGS. 1B-5B illustrate cross-sectional views taken along an X-direction of the semiconductor structure 100, where the Y-direction is orthogonal or perpendicular to the X-direction. It may be said that FIGS. 1A-5A illustrate a Y-cut of the semiconductor structure 100, while FIGS. 1B-5B illustrate an X-cut of the semiconductor structure 100.

In the illustrated embodiments, the semiconductor structure 100 includes a GAA device (e.g., an HGAA device). The GAA device may be fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Referring to FIGS. 1A-1B, the semiconductor structure 100 includes a fin-like structure 104 (referred hereinafter as a "fin" for reasons of simplicity) that protrudes vertically upward in a Z-direction, where the Z-direction is orthogonal to a horizontal plane defined by the Y-direction and the X-direction. The fin 104 includes a stack of alternatingly disposed semiconductor layers 108 and 110.

The semiconductor layers 108 and 110 are vertically stacked (along the "Z" direction) in an interleaving or alternating fashion (e.g., a layer 110 disposed over a layer 108, then another layer 108 disposed over the layer 110, so on and so forth). In various embodiments, the structure 100 may include any number of fins 104, and the fins 104 may include any number of alternately stacked semiconductor layers 108 and 110. The material compositions of the semiconductor layers 108 and 110 are configured such that they have an etching selectivity in a subsequent etching process discussed in more detail below. For example, in some embodiments, the semiconductor layer 108 contains silicon (Si), while the semiconductor layer 110 contains silicon germanium (SiGe). In some other embodiments, the semiconductor layer 108 contains SiGe, while the semiconductor layer 110 contains Si. It is understood that although FIG. 1A illustrates one fin 104, the semiconductor structure 100 may include a plurality of other fins similar to the fin 104.

As shown in FIG. 1A, the lower portions of the fin 104 are surrounded by an isolation structure 106. In some embodiments, the isolation structure 106 includes shallow trench isolation (STI). The isolation structure 106 may contain an electrically insulating material such as silicon oxide. Also as shown in FIG. 1A, spacers 112 and spacers 114 are also disposed around the bottom portion of the fin structure 104, for example around one of the semiconductor layers 108. The spacers may contain a suitable dielectric material, for example silicon nitride, silicon oxide, silicon oxynitride, or combinations thereof.

A dummy gate stack 105 is formed over an uppermost one of the semiconductor layers 108. The dummy stack 105 includes a dielectric layer 120. In some embodiments, the dielectric layer 120 contains silicon oxide. In other embodiments, the dielectric layer 120 contains a high-k dielectric material. A high-k dielectric material is a material having a dielectric constant that is greater than a dielectric constant of $SiO_2$, which is approximately 4. For example, the high-k gate dielectric includes hafnium oxide ($HfO_2$), which has a dielectric constant that is in a range from about 18 to about 40. As various other examples, the high-k gate dielectric may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO. The dummy gate stack 105 also includes a polysilicon layer 130 formed over the dielectric layer 120.

The dummy gate stack 105 may undergo a gate replacement process to form a high-k metal gate, as discussed in greater detail below.

Gate spacers 140 are formed on sidewalls of the dielectric layer 120 and the polysilicon layer 130. The gate spacers 140 contain a dielectric material, for example silicon nitride, silicon oxide, silicon carbide, silicon oxycarbide (SiOC), silicon oxycarbon nitride (SiOCN), other materials, or a combination thereof. The gate spacers 140 may include a single layer or a multi-layer structure. In some embodiments, the gate spacers 140 have a thickness in a range of a few nanometers (nm). In some embodiments, the gate spacers 140 may be formed by depositing a spacer layer (containing a dielectric material) over the dummy gate stack 105, followed by an anisotropic etching process to remove portions of the spacer layer 140 from a top surface of the dummy gate stack 105. After the etching, portions of the spacer layer substantially remain on the sidewall surfaces of the dummy gate stack 105 and become the gate spacer 140. In some embodiments, the anisotropic etching process is a dry (e.g., plasma) etching process. It is understood that the formation of the gate spacers 140 may also involve chemical oxidation, thermal oxidation, ALD, CVD, and/or other suitable methods. The gate spacers 140, along with the dummy gate stack 105, will be used to help define the physical and/or electrical length of the channels of the semiconductor structure 100. In some embodiments, the gate spacers 140 may be considered a part of the dummy gate stack 105, even though the gate spacers 140 will not be removed in the gate replacement process discussed below.

Openings 150 are defined by the separation between adjacent spacers 140. The openings 150 may be formed by an etching process (etching through the gate spacer material) and expose the semiconductor layer 108 below. The openings 150 each have a horizontal dimension 160 measured in the X-direction. Meanwhile, the dummy gate stacks (e.g., the polysilicon layer 130) each have a horizontal dimension 170 measured in the X-direction, and the gate spacers 140 each have a horizontal dimension 180 measured in the X-direction. In some embodiments, the horizontal dimension 160 is in a range from about 8 nm to about 12 nm (e.g., about 10 nm), the horizontal dimension 170 is in a range from about 10 nm to about 14 nm (e.g., about 12 nm), and the horizontal dimension 180 is in a range from about 5 nm to about 8 nm (e.g., about 6.5 nm). It is understood that the dimension 170 helps define a physical gate length of the HGAA transistor.

Figure 2A:
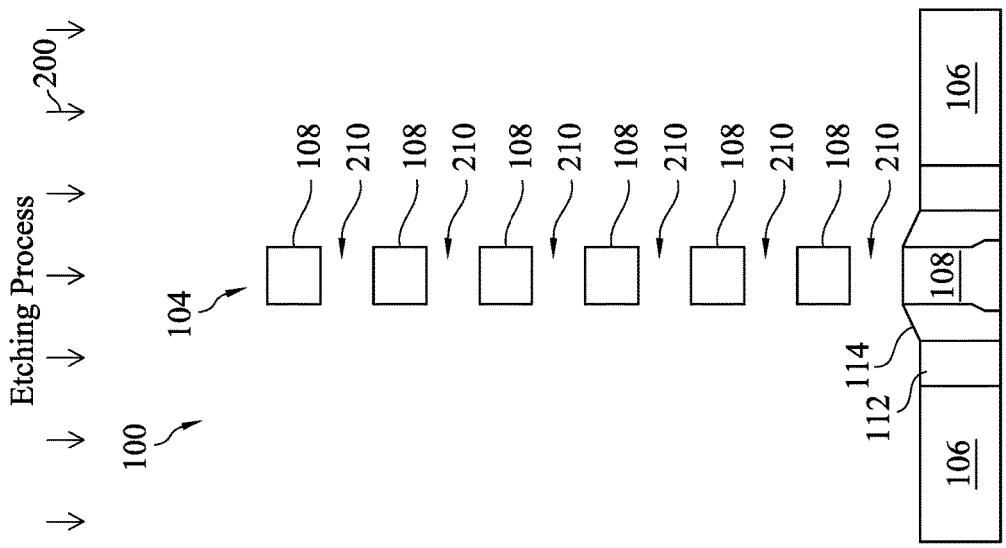

Referring now to FIGS. 2A-2B, an etching process 200 is performed to the semiconductor structure 100. During the etching process 200, the spacers 140 and the dummy gate stack 105 protect the layers therebelow from being etched. The etching process 200 selectively removes portions of the semiconductor layer 110 that are vertically aligned with the openings 150, while leaving the semiconductor layer 108 substantially unetched. As a result of the etching process 200, spaces or voids 210 are formed in place of the portions of the semiconductor layer 110 that are etched away. The spaces/voids 210 will eventually be filled with an epitaxially-grown doped semiconductor material so that they can serve as the source/drain of HGAA transistors. This will be discussed in more detail below.

Still referring to FIG. 2B, the spaces or voids 210 each have a horizontal dimension (measured in the X-direction) 230 that is substantially equal to the horizontal dimension 160 that defines the width of each of the openings 150. Meanwhile, the semiconductor layer 110 has a horizontal dimension 250. In some embodiments, the horizontal dimension 250 is in a range between about 20 nm and about 30 nm.

In some embodiments, the etching process 200 may include a selective wet etching process. The selective wet etching process may include a hydro fluoride (HF) etchant or a NH₄OH etchant. In an embodiment where the semiconductor layers 110 comprise SiGe and the semiconductor layers 108 comprise Si, the selective removal of the SiGe layers 110 may include a SiGe oxidation process (to turn the SiGe into SiGeOx) followed by a SiGeOx removal. The SiGe oxidation process may include forming and patterning various masking layers such that the oxidation is controlled to the SiGe layers 110. In other embodiments, the SiGe oxidation process is a selective oxidation due to the different compositions of the semiconductor layers 110 and 108. In some examples, the SiGe oxidation process may be performed by exposing the structure 100 to a wet oxidation process, a dry oxidation process, or a combination thereof. Thereafter, the oxidized semiconductor layers (which include SiGeOx) are removed by an etchant such as NH₄OH or diluted HF. In various embodiments, the semiconductor layers 110 and 108 provide for different oxidation rates and/or different etch selectivity, which enables the selective removal of the semiconductor layers 110 by the etching.

Referring now to FIGS. 3A-3B, after the etching process 200 is performed, a lateral etching process 300 is performed to the semiconductor structure 100 to etch the semiconductor layer 110 laterally (e.g., horizontally in the X-direction). This lateral etching process 300 may also be referred to as a proximity push process. In some embodiments, the extent of the lateral etching (or the amount of the semiconductor layer 110 etched away) can be configured by controlling an etching time of the lateral etching process 300. In some embodiments, the etching process 300 is an isotropic etching process. In some embodiments, the etching process 300 is performed using wet etching or dry etching with low (e.g., <0.1 volts) or no vertical bias voltage.

As a result of the lateral etching process 300, the spaces/voids 210 shown in FIG. 2B are transformed (e.g., enlarged laterally/horizontally) into spaces/voids 210A as shown in FIG. 3B. The laterally enlarged spaces/voids 210A each have a horizontal dimension (measured in the X-direction) 230A. Compared to the horizontal dimension 230 of the spaces/voids 210, the horizontal dimension 230A of the enlarged spaces/voids 210A is wider (in the X-direction) by a distance 240 on each side (left side and right side). The distance 240 may also be referred to as a proximity push. In some embodiments, the distance 240 is greater than 0, but less than the thickness/horizontal dimension 180 of the gate spacer 140. For instance, the distance 240 may be in a range that is greater than about 2 nm but less than about 6 nm, for example about 4 nm.

The increased dimension 230A due to the lateral etching process 300 means that the dimension 250 of the semiconductor layer 110 is reduced into dimension 250A. Whereas the dimension 170 of the dummy gate stack (discussed above with reference to FIG. 1B) defines the physical gate length of the transistor, the dimension 250A corresponds to an electrical length of the channel of the HGAA transistor formed by the semiconductor structure 100. Since the dimension 250A can be adjusted by controlling the amount of lateral etching of the semiconductor layer 110 via the lateral etching process 300, the electrical length of the channel can be adjusted accordingly as well. This aspect of the present disclosure will be discussed in greater detail below.

Referring now to FIGS. 4A-4B, an etching process 400 is performed to the semiconductor structure 100 is performed. In some embodiments, the etching process 400 is configured to have low etching selectivity or no etching selectivity. As a result of the etching process 400, some portions of the semiconductor layer 108 wrapping around the spaces/voids 210A are trimmed. The remaining portions of the semiconductor layer 108 that wrap around the spaces/voids 210A may be referred as nanowires 108A. The nanowires 108A have shrunken dimensions (measured in the Z-direction) compared to the portion of the semiconductor layer 108 disposed below the dummy gate stack and that was unaffected by the etching process 400. As such, the etching process 400 may also be referred to as a nanowire shrinkage process. The nanowires 108A may serve as a part of the source/drain (S/D) of the HGAA transistors, and regions corresponding to the locations of the nanowires 108A may be referred to as S/D regions 410. Meanwhile, the rest of the semiconductor layers 108 may serve as the channels of the HGAA transistors.

Referring now to FIGS. 5A-5B, an epitaxial growth process 500 is performed to grow semiconductor elements 510 in the S/D regions 410 of the semiconductor structure 100. In some embodiments, the epitaxial growth process 500 includes a molecular beam epitaxy (MBE) process, or a chemical vapor deposition process, and/or other suitable epitaxial growth processes. In some further embodiments, the semiconductor elements 510 is in-situ or ex-situ doped with an n-type dopant or a p-type dopant. For example, in some embodiments, the semiconductor elements 510 includes silicon-germanium (SiGe) doped with boron for forming S/D features for a PFET. In some embodiments, the semiconductor elements 510 include silicon doped with phosphorous for forming S/D features for a NFET. In various embodiments, arsenic and antimony are also used as dopants in the S/D features. To further these embodiments, the semiconductor elements 510 may include Ge ranging from about 10% to about 70% in molar ratio. In certain embodiments, the semiconductor elements 510 are highly doped in order to form an ohmic contact with an S/D contact metal to be later formed.

As a result of the epitaxial growth process 500, the semiconductor elements 510 fill in the spaces/voids 210A that are shown in FIG. 4B. The semiconductor elements 510 each wrap around (e.g., circumferentially in 360 degrees in the cross-sectional view shown in FIG. 5A) a respective one of the nanowires 108A. For example, the semiconductor elements 510 may be in direct physical contact with the nanowires 108A on all four sides thereof (in the illustrated embodiment where the nanowires 108A each have a square-like shape in a cross-sectional side view). In some embodiments, a thickness 520 of the semiconductor elements 510 ranges from a few nanometers to several tens of nanometers.

In an embodiment, the semiconductor elements 510 have the same material composition as the semiconductor layer 108 (and the nanowires 108A). For example, the semiconductor elements 510 and the semiconductor layer 108 both include silicon. In some alternative embodiments, the semiconductor elements 510 and 108 may have different materials or compositions. In various embodiments, the semiconductor elements 510 may include a semiconductor material such as silicon or germanium, a compound semiconductor such as silicon germanium, silicon carbide, gallium arsenide, gallium phosphide, indium phosphide, indium arsenide, indium antimonide, an alloy semiconductor such GaAsP, AlInAs, AlGaAs, InGaAs, GaInP, and/or GaInAsP, or combinations thereof.

The semiconductor elements 510 and the nanowires 108A may collectively serve as the S/D features for the semiconductor structure 100. In some embodiments, the semiconductor elements 510 and the nanowires 108A may include the same type of dopant (e.g., both are n-type doped, or both are p-type doped), but the dopant concentration is higher in the semiconductor elements 510 than in the nanowires 108A. Alternatively, the semiconductor elements 510 and the nanowires 108A may include the same type of dopants but may have different dopant species.

As discussed above with reference to FIG. 3B, the electrical length (e.g., the horizontal dimension 250A of the semiconductor layer 110 below the gate stack) of the channel can be adjusted by the lateral etching process 300. According to the various aspects of the present disclosure, different regions of the semiconductor structure 100 may be configured to have different electrical lengths. This is discussed in detail below with reference to FIGS. 6-10, which illustrate diagrammatic fragmentary cross-sectional side views (in the Y-Z plane, similar to FIGS. 1B-5B) of an embodiment of the semiconductor structure 100 at different stages of fabrication. Some of the fabrication processes shown in FIGS. 6-10 have been described above with reference to FIGS. 1A-5A and 1B-5B. Therefore, for reasons of clarity and consistency, similar elements appearing in FIGS. 6-10 are labeled the same as they were in FIGS. 1A-5A and 1B-5B to the extent that it is appropriate.

Referring to FIG. 6, the semiconductor structure 100 includes the plurality of semiconductor layers 108 and 110 disposed in an alternating or interleaving fashion in a vertical direction (e.g., Z-direction). A plurality of dummy gate stacks 105 is formed over the uppermost semiconductor layer 108. The dummy gate stacks 105 each include the dielectric layer 120 and the polysilicon layer 130 formed over the dielectric layer 120. Gate spacers 140 are formed on sidewalls of the dielectric layer 120 and the polysilicon layer 130. The gate spacers 140 may also be considered a part of the dummy gate stacks 105 in some embodiments. As discussed above, the polysilicon layer 130 will undergo a gate replacement process later to be replaced with metal gate layer. In some embodiments, the dielectric layer 120 will also be replaced with a high-k dielectric by the gate replacement process.

Some of the dummy gate stacks 105 are located in a region 610 of the semiconductor structure 100, while other dummy gate stacks 105 are located in a different region 620 of the semiconductor structure 100. In some embodiments, the region 610 includes a standard threshold voltage (SVt) region, while the region 620 includes a high threshold voltage (HVt) region. Compared to transistors located in the SVt region 610, transistors located in the HVt region 620 have a higher threshold voltage (Vt) and consume less power. Therefore, the transistors in the HVt region may be suitable for power-critical applications.

Figure 7:
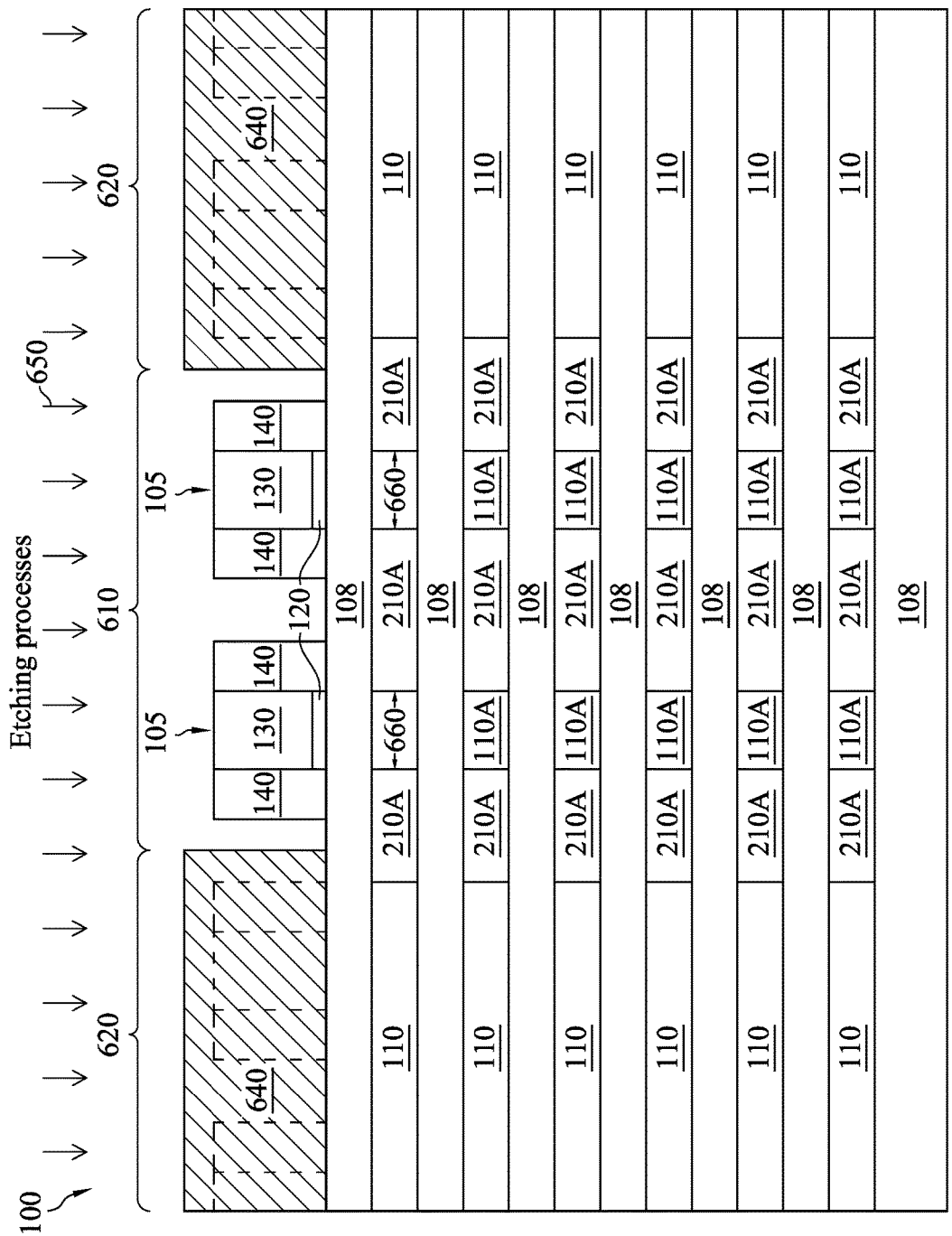

Referring now to FIG. 7, a patterned photoresist layer 640 is formed over the uppermost semiconductor layer 108 and over the dummy gate stacks 105 in the region 620. The formation of the patterned photoresist layer 640 may include processes such as photoresist deposition, exposing, post-exposure baking, and developing. The patterned photoresist layer 640 leaves an opening in the region 610 that exposes the dummy gate stacks 105 and the semiconductor layer 108 in the region 610.

With the patterned photoresist layer 640 serving as an etching mask, etching processes 650 are performed to etch the semiconductor layers 110 in the region 610. For example, the etching process processes 650 include the etching process 200 discussed above with reference to FIGS. 2A and 2B, which is performed herein to selectively remove portions of the semiconductor layer 110 in the region 610, thereby forming spaces/voids in the region 610. The etching processes 650 also includes the lateral etching process 300 discussed above with reference to FIGS. 3A-3B, which is performed herein to laterally extend the spaces/voids inward to form enlarged spaces/voids 210A.

The remaining segments 110A of the semiconductor layer 110 under the dummy gate stacks 105 in the region 610 each have a horizontal dimension (measured in the X-direction) 660. As discussed above, the value for the horizontal dimension 660 can be configured by adjusting the parameters of the lateral etching process 300, for example by controlling the etching time. As an example, as the etching time of the lateral etching process 300 increases, the spaces/voids 210A becomes wider (due to more lateral etching), and the dimension 660 shrinks. Again, the dimension 660 corresponds to the effective electrical length of the channel of the HGAA transistor in the region 610.

Since the patterned photoresist layer 640 serves as a protective mask during the etching processes 650, the semiconductor layer 110 located in the region 620 is substantially unaffected during the stage of fabrication shown in FIG. 7.

Figure 8:
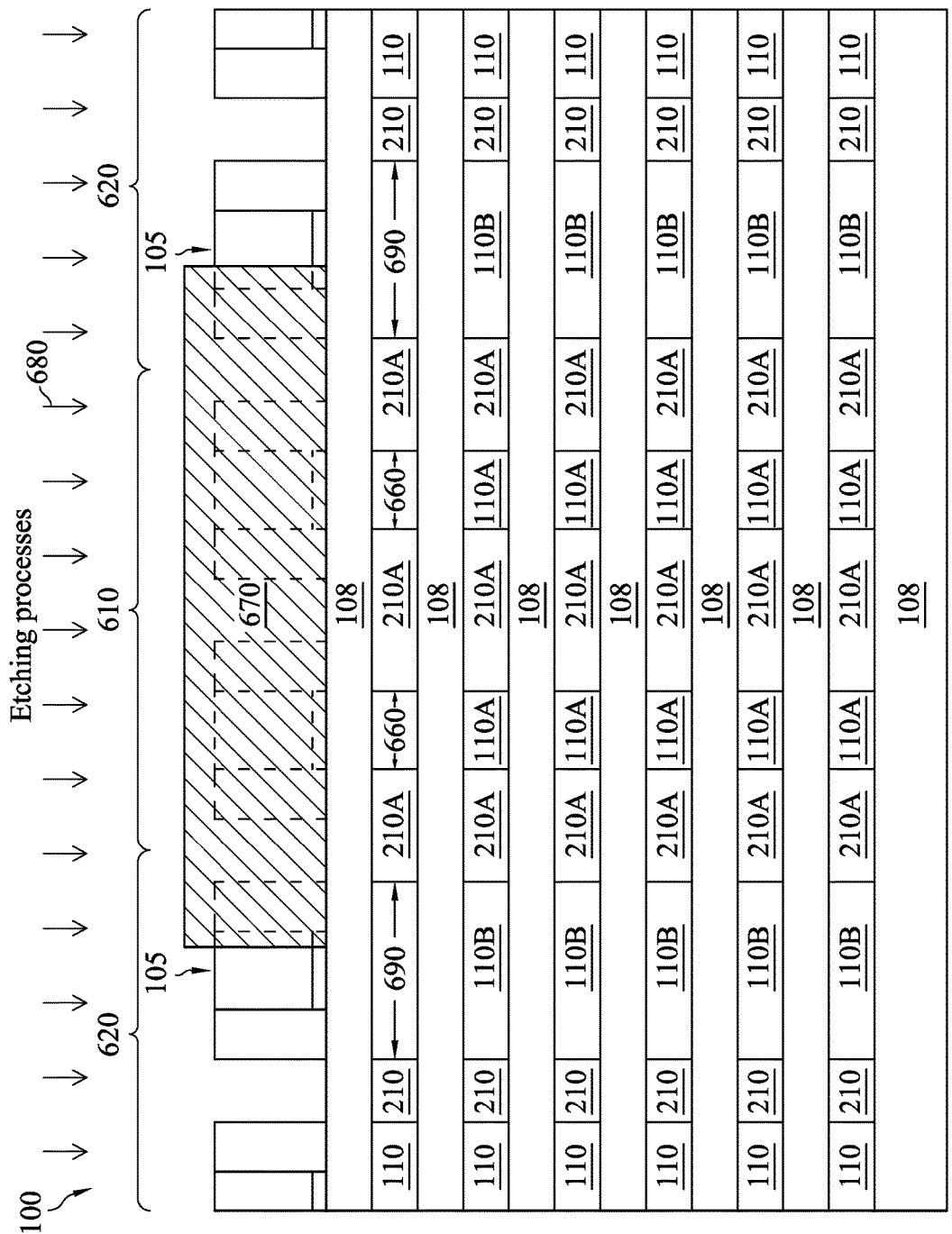

Referring now to FIG. 8, a patterned photoresist layer 670 is formed over the uppermost semiconductor layer 108 and over the dummy gate stacks 105 in the region 610. The formation of the patterned photoresist layer 670 may include processes such as photoresist deposition, exposing, post-exposure baking, and developing. The patterned photoresist layer 670 leaves openings in the region 620 and exposes the dummy gate stacks 105 and the semiconductor layer 108 in the region 620.

With the patterned photoresist layer 670 serving as an etching mask, etching processes 680 are performed to etch the semiconductor layers 110 in the region 620. For example, the etching process processes 680 include the etching process 200 discussed above with reference to FIGS. 2A and 2B, which is performed herein to selectively remove portions of the semiconductor layer 110 in the region 620, thereby forming spaces/voids 210 in the region 620.

The remaining segments 110B of the semiconductor layer 110 under the dummy gate stacks 105 in the region 620 each have a horizontal dimension (measured in the X-direction) 690. As discussed above, the value for the horizontal dimension 690 can be configured by adjusting the parameters of the lateral etching process 300, for example by controlling the etching time. As an example, as the etching time of the lateral etching process 300 increases, the spaces/voids 210A become wider (due to more lateral etching), and the dimension 690 shrinks. Again, the dimension 690 corresponds to the effective electrical length of the channel of the HGAA transistor in the region 620.

It is understood that although the etching processes 680 in the embodiment shown in FIG. 8 do not involve the lateral etching process 300 discussed above with reference to FIGS. 3A-3B (which could be performed to laterally extend the spaces/voids 210 inward), the lateral etching process 300 may still be performed as a part of the etching processes 680 in alternative embodiments, if needed. For example, the optional performance of the lateral etching process 300 would offer a great degree of control for the value of the dimension 690.

Figure 9:
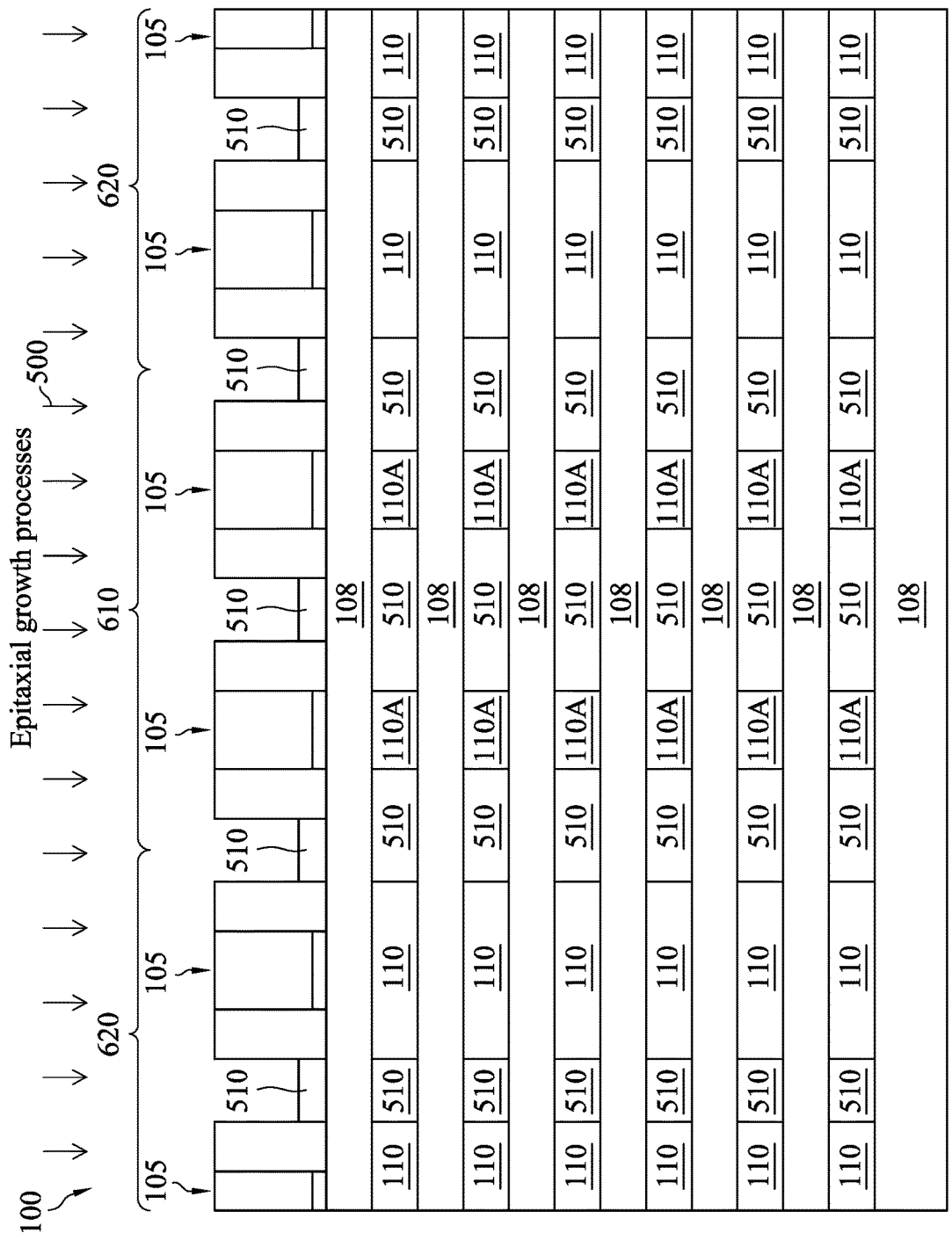

Referring now to FIG. 9, the epitaxial growth process 500 discussed above with reference to FIGS. 5A-5B is performed to the semiconductor structure 100 to epitaxially grow the semiconductor elements 510 to fill in the spaces/ voids 210/210A. In some embodiments, it takes a longer time to fill the spaces 210A than the spaces 210. Thus, in embodiments where the same S/D epitaxy process is used for both the spaces 210A and 210, the epitaxy material grown in the spaces 210 would be larger than the epitaxy material grown in the spaces 210A. This size difference is a result of the unique process flows described herein and may be a recognizable characteristic of devices fabricated according to the processes of the present disclosure. As discussed above with reference to FIGS. 5A-5B, the semiconductor elements 510 each wraps around a respective one of the semiconductor layers 108, for example circumferentially in 360 degrees. Again, the semiconductor elements 510 (along with the portions of the semiconductor layer 108 being wrapped around) may serve as the S/D features for the semiconductor structure 100.

Although not specifically illustrated in detail in FIG. 9, it is understood that the etching process 400 discussed above with reference to FIGS. 4A and 4B may also be performed to trim or shrink portions of the semiconductor layer between the spaces/voids 210/210A, before the epitaxial growth process 500 is performed.

Figure 10:
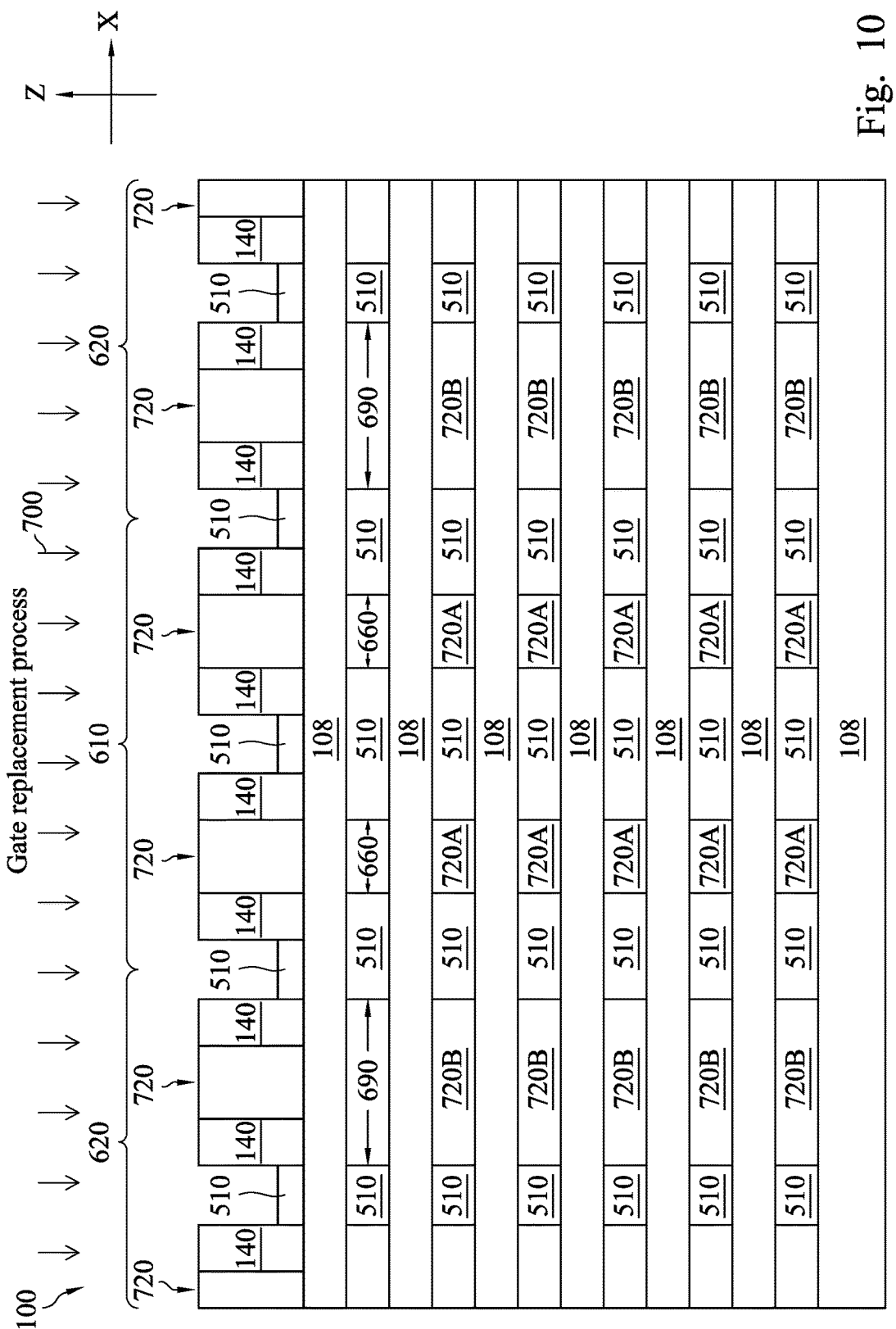

Referring now to FIG. 10, a gate replacement process 700 is performed to the semiconductor structure 100 to replace the dummy gate stacks 105 and the semiconductor layers 100 disposed therebelow with high-k metal gates 720. As a part of the gate replacement process 700, the polysilicon layer 130 (and the dielectric layer 120 if it is a dummy gate oxide) is removed, for example by suitable etching processes. Portions of the semiconductor layer 110 and 110A disposed below the dummy gate stacks 105 are also removed. The removal of the polysilicon layer 130 and the dielectric layer 120 form openings defined by the gate spacers 140. These openings are filled with high-k metal gates 720 that each includes a high-k gate dielectric and a metal gate electrode.

Figure 11:
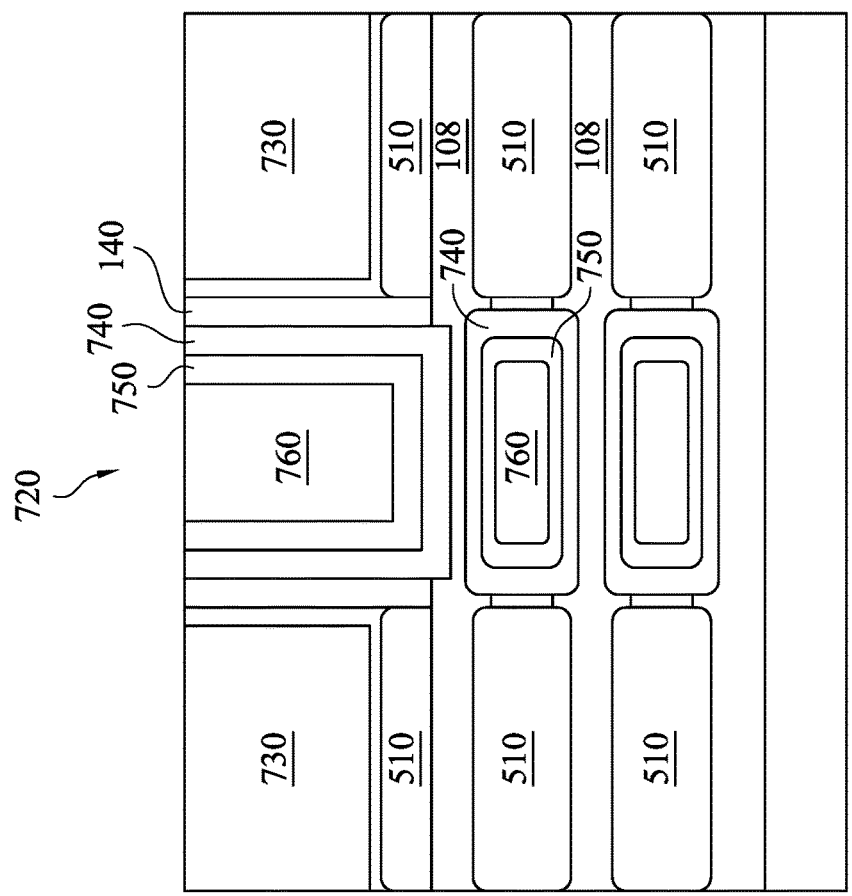

FIG. 11 illustrates a more detailed cross-sectional view of the replacement high-k metal gate 720. The cross-sectional view is taken along the Z-X plane. A dielectric isolation structure 730 is formed around the gate spacers 140, for example before the removal of the dummy gate stacks. After the removal of the polysilicon layer 130 and the dielectric layer 120, the gate spacers 140 (along with the dielectric isolation structure 730) define an opening for the high-k metal gate 720 to fill in. A high-k dielectric 740 is formed in the opening, for example. As discussed above, the high-k dielectric layer 740 may include a high-k material (e.g., having a dielectric constant greater than silicon oxide) such as hafnium oxide, zirconium oxide, lanthanum oxide, titanium oxide, yttrium oxide, strontium titanate, other suitable metal-oxides, or combinations thereof.

A work function metal layer 750 may be formed over the high-k dielectric layer 740. The work function metal layer 750 may include work function metals configured to tune a work function of a transistor. The work function metal 750 layer may be a p-type work function metal layer or an n-type work function metal layer. The p-type work function metal layer comprises a metal selected from, but not limited to, the group of titanium nitride, tantalum nitride, ruthenium, molybdenum, tungsten, platinum, or combinations thereof. The n-type work function metal layer comprises a metal selected from, but not limited to, the group of titanium, aluminum, tantalum carbide, tantalum carbide nitride, tantalum silicon nitride, or combinations thereof. The p-type or n-type work function metal layer may include a plurality of layers and may be deposited by CVD, PVD, and/or other suitable process.

A fill metal 760 is formed over the work function metal layer 750. The fill metal 760 may serve as the main electrically conductive portion of the metal gate electrode. The fill metal 760 may include aluminum, tungsten, cobalt, copper, and/or other suitable materials, and may be formed by CVD, PVD, plating, and/or other suitable processes.

The high-k metal gates filling the openings (formed by the removal of the semiconductor layer 110/110A) also have the high-k dielectric layer 740, the work function metal layer 750, and the fill metal 760. As is shown in FIG. 11, the work function metal layer 750 circumferentially wraps around the fill metal 760, and the high-k dielectric layer 740 also circumferentially wraps around the work function metal layer 750. Meanwhile, the portions of the semiconductor layer 108 are also wrapped around by the high-k metal gates (that include the high-k dielectric layer 740 and the metal layers 750-760). These portions of the semiconductor layer 108 serve as the channels of the transistor. The semiconductor structure 100 includes a plurality of these vertically "stacked" high-k metal gates, and thus the semiconductor structure 100 is a stacked horizontal gate-all-around (S-HGAA) device.

Returning now to FIG. 10, it can be seen that the high-k metal gate structures 720A formed in the region 610 have different lateral dimensions than the high-k metal gate structures 720B formed in the region 620. Specifically, the high-k metal gate structures 720A formed in the region 610 have the lateral dimension 660 (measured in the X-direction), while the high-k metal gate structures 720B formed in the region 620 have the lateral dimension 690 (measured in the X-direction). The lateral dimension 690 is greater than or less than the lateral dimension 660. For example, in the embodiment shown in FIG. 10, the lateral dimension 690 may be greater than the lateral dimension 660 by about 5-10 nm in some embodiments. A ratio exists between the lateral dimension 690 and the lateral dimension 660. In some embodiments, the ratio is in a range between about 1.5 and about 2.

As discussed above, the difference in the lateral dimensions 660 and 690 may be configured by carefully controlling the process parameters of the etching processes 650 and/or 680. Since the lateral dimension 660 corresponds to the effective electrical length of the channel for the HGAA transistor in the region 610, and the lateral dimension 690 corresponds to the effective electrical length of the channel for the HGAA transistor in the region 620, it can be seen that the semiconductor structure 100 can have different effective electrical lengths for different regions, even though the physical gate lengths (defined by the size of the dummy gate stacks) are substantially the same.

Figure 12:
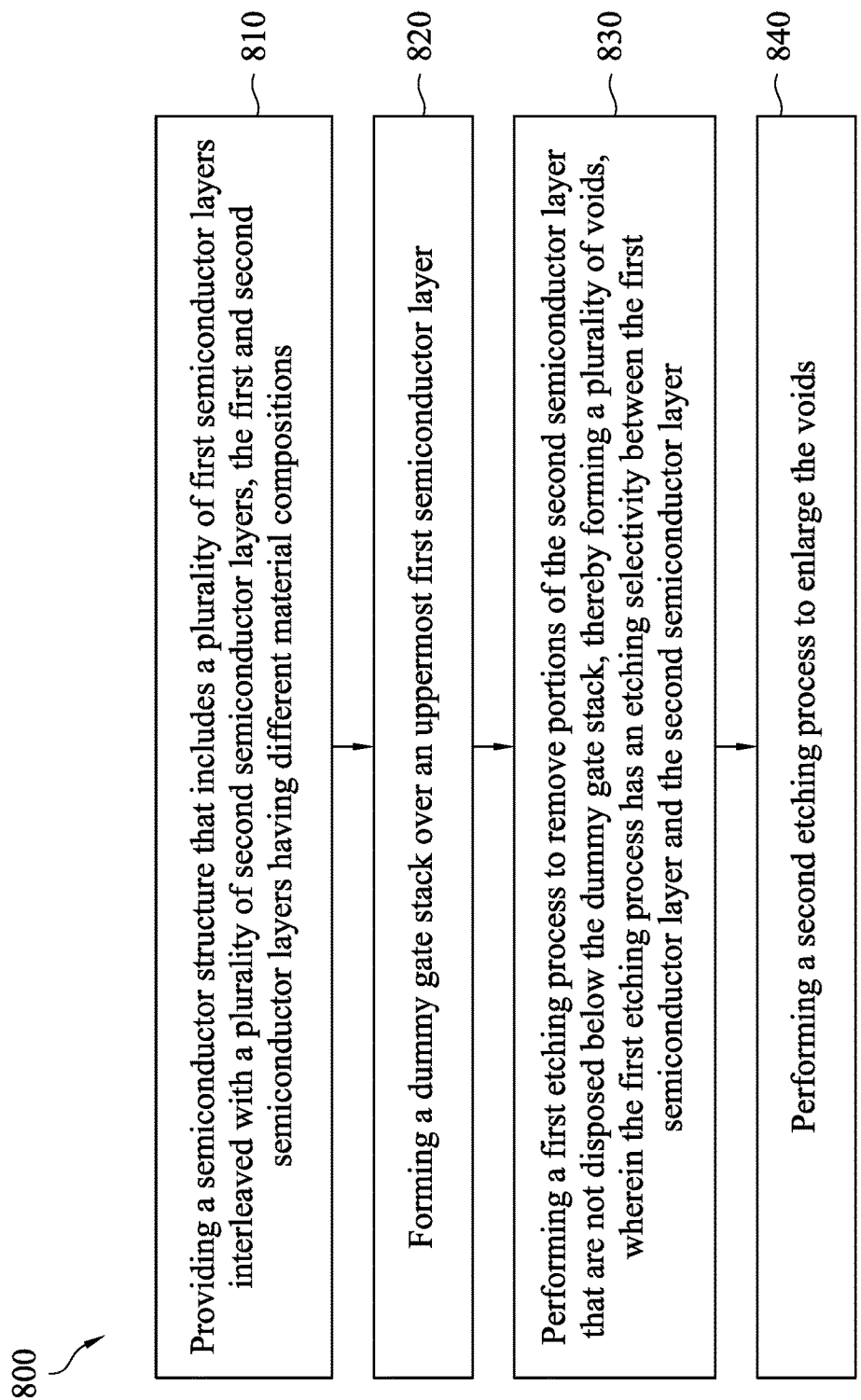
FIG. 12 is a flowchart illustrating a method of fabricating a semiconductor structure according to various aspects of the present disclosure.

FIG. 12 is a flowchart illustrating a method 800 of manufacturing a semiconductor structure, for example a GAA device. The method 800 includes a step 810 of providing a semiconductor structure that includes a plurality of first semiconductor layers interleaved with a plurality of second semiconductor layers. The first and second semiconductor layers have different material compositions.

The method 800 includes a step 820 of forming a dummy gate stack over an uppermost first semiconductor layer. In some embodiments, the forming the dummy gate stack comprises forming a plurality of dummy gate stacks in a first region and a second region of the semiconductor structure. In some embodiments, the first region is a standard threshold voltage (SVt) region, and the second region is a high threshold voltage (HVt) region.

The method 800 includes a step 830 of performing a first etching process to remove portions of the second semiconductor layer that are not disposed below the dummy gate stack, thereby forming a plurality of voids. The first etching process has an etching selectivity between the first semiconductor layer and the second semiconductor layer. In some embodiments, the etching selectivity between the first semiconductor layer and the second semiconductor layer is configured such that the first etching process removes the portions of the second semiconductor layer without removing the first semiconductor layer.

The method 800 includes a step 840 of performing a second etching process to enlarge the voids. In some embodiments, the second etching process is performed to enlarge a horizontal dimension of each of the voids. In some embodiments, the first etching process and the second etching process are performed such that voids in the first region and voids in the second region have different horizontal dimensions. In some embodiments, the second etching process is performed in the first region but not in the second region.

In some embodiments, the first semiconductor layers each include a silicon layer, and the second semiconductor layers each include a silicon germanium layer.

It is understood that additional processes may be performed before, during, or after the steps 810-840. For example, the method 800 may include a step of epitaxially growing a third semiconductor layer in the enlarged voids. As another example, the method 800 may include a step of replacing the dummy gate stack with a gate structure having a high-k gate dielectric and a metal gate electrode. In some embodiments, the replacing the dummy gate stack comprises replacing portions of the second semiconductor layer disposed below the dummy gate with a plurality of gate structures having a high-k gate dielectric and a metal gate electrode. In some embodiments, for each of the gate structures that replace the portion of the second semiconductor layer, the high-k gate dielectric circumferentially wraps around the metal gate electrode. As other examples, the method 800 may include steps of forming contact openings, contact metal, as well as various contacts, vias, wires, and multilayer interconnect features (e.g., metal layers and interlayer dielectrics) to connect the various features to form a functional circuit that may include one or more multi-gate devices.

Based on the above discussions, it can be seen that the embodiments of the present disclosure offer advantages over conventional semiconductor devices. It is understood, however, that no particular advantage is required, other embodiments may offer different advantages, and that not all advantages are necessarily disclosed herein.

On advantage is that, being able to configure different effective electrical lengths for the channel allows the threshold voltage Vt to be adjusted with more flexibility. In more detail, as semiconductor device sizes shrink, the channels for the transistors are becoming shorter and shorter, which introduces various problems, especially for GAA devices. For example, GAA devices have smaller depletion regions than conventional planar devices or conventional FinFET devices. As a result, the dosage of the Vt implant may need to be heavier than conventional devices. However, the heavy doping may induce mobility degradations, which are undesirable. Furthermore, GAA devices have a smaller channel volume than conventional devices, since the channels for the GAA devices are composed of a plurality of nanowires (rather than a single block of material as in conventional devices). As such, the doping of the nanowires may cause some of these nanowire channels to receive a significantly higher number of dopants than some of the other nanowires. This leads to worse random doping fluctuations for GAA devices. For these reasons discussed above, it is difficult for GAA devices to adjust its Vt by implanting/doping.

In comparison, the present disclosure allows threshold voltage adjustment by controlling the effective electrical length for the channel of the transistor. For example, the lateral etching process discussed above with reference to FIG. 3B can be configured to adjust the lateral dimension of the high-k metal gate stack, which corresponds to an adjustment of the electrical length for the channel. This allows the threshold voltage Vt to be configured accordingly.

In addition, the present disclosure allows for different effective gate lengths to be provided for different regions. For example, one gate length can be provided for a high Vt region, while a different gate length can be provided for a standard Vt region. This capability further increases the versatility of the semiconductor structure manufactured according to the present disclosure. Furthermore, this capability also means that there is no need to put a dummy polysilicon between the high Vt region and the standard Vt region. In turn, this leads to a reduction in cell size. Other advantages include the elimination of the random doping fluctuation defect in GAA devices, since the present disclosure does not re quire a Vt implant anymore.

One embodiment of the present disclosure involves a method of fabricating a GAA device. A semiconductor structure is provided that includes a plurality of first semiconductor layers interleaved with a plurality of second semiconductor layers. The first and second semiconductor layers have different material compositions. A dummy gate stack is formed over an uppermost first semiconductor layer. A first etching process is performed to remove portions of the second semiconductor layer that are not disposed below the dummy gate stack, thereby forming a plurality of voids. The first etching process has an etching selectivity between the first semiconductor layer and the second semiconductor layer. Thereafter, a second etching process is performed to enlarge the voids.

Another embodiment of the present disclosure involves a method of fabricating a GAA device. A semiconductor structure is provided that includes a plurality of first semiconductor layers and a plurality of second semiconductor layers. The first and second semiconductor layers have different material compositions and are alternatingly disposed with respect to each other in a vertical direction. A plurality of dummy gate stacks is formed over an uppermost first semiconductor layer. Portions of the second semiconductor layer in a first region of the semiconductor structure are removed, thereby forming a plurality of first spaces in place of the removed portions of the second semiconductor layer in the first region. The first spaces are extended horizontally via a lateral etching process. Thereafter, portions of the second semiconductor layer in a second region of the semiconductor structure are removed, thereby forming a plurality of second spaces in place of the removed portions of the second semiconductor layer in the second region. The remaining portions of the second semiconductor layer in the first region have different horizontal dimensions than remaining portions of the second semiconductor layer in the second region.

Yet another embodiment of the present disclosure involves a semiconductor structure. The semiconductor structure includes a plurality of nanowires each extending in a first direction. The nanowires are stacked over one another in a second direction perpendicular to the first direction. The semiconductor structure includes a plurality of first gate structures and second gate structures that each wraps around a respective one of the nanowires. The first gate structures each have a first dimension measured in the first direction. The second gate structures each have a second dimension measured in the first direction, the first dimension being greater than or less than the second dimension.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a plurality of nanowires each extending in a first direction, wherein the nanowires are stacked over one another in a second direction perpendicular to the first direction; and
a plurality of first gate structures and second gate structures that each wrap around a respective one of the nanowires, wherein the first gate structures each have a first dimension measured in the first direction, and wherein the second gate structures each have a second dimension measured in the first direction, the first dimension being greater than or less than the second dimension.

2. The semiconductor structure of claim 1, further comprising a plurality of third gate structures disposed over an uppermost one of the nanowires, wherein:
the first gate structures are disposed below a first subset of the third gate structures; and
the second gate structures are each disposed below a second subset of the third gate structures.

3. The semiconductor structure of claim 2, wherein the third gate structures have same dimensions as one another in at least the first direction.

4. The semiconductor structure of claim 2, wherein the third gate structures have unequal dimensions with at least the first gate structures or the second gate structures in the first direction.

5. The semiconductor structure of claim 2, wherein gate spacers are disposed on sidewalls of the third gate structures but not on sidewalls of the first or second gate structures.

6. The semiconductor structure of claim 2, wherein the first, second, and third gate structures each include a high-k gate dielectric and a metal gate electrode, and wherein the high-k gate dielectric at least partially wraps around the metal gate electrode.

7. The semiconductor structure of claim 1, wherein:
the first gate structures are located in a standard threshold voltage (SVt) region of the semiconductor structure; and
the second gate structures are located in a high threshold voltage (HVt) region of the semiconductor structure.

8. The semiconductor structure of claim 7, wherein the first dimension is less than the second dimension.

9. The semiconductor structure of claim 1, wherein a ratio between the second dimension and the first dimension is in a range between about 1.5:1 and about 2:1.

10. The semiconductor structure of claim 1, further comprising a plurality of source/drain components that each wraps around a respective one of the nanowires.

11. The semiconductor structure of claim 10, wherein each of the source/drain components wraps around the respective one of the nanowires circumferentially in 360 degrees.

12. The semiconductor structure of claim 1, wherein:
each of the nanowires includes a plurality of first portions and a plurality of second portions; and
the first portions and the second portions have unequal dimensions measured in the second direction.

13. The semiconductor structure of claim 12, wherein:
the first portions, but not the second portions, are aligned with the first gate structures or with the second gate structures; and
the first portions have greater dimensions in the second direction than the second portions.

14. A semiconductor structure, comprising:
a plurality of nanowires each extending in a first direction, wherein the nanowires are separated from one another in a second direction different from the first direction; and
a plurality of first gate structures that wrap around a plurality of first regions of the nanowires;
a plurality of second gate structures that wrap around a plurality of second regions of the nanowires, wherein the first gate structures and the second gate structures have unequal dimensions in the first direction; and
a plurality of source/drains that wrap around a plurality of third regions of the nanowires.

15. The semiconductor structure of claim 14, wherein:
the first gate structures are associated with first transistors having a first threshold voltage;
the second gate structures are associated with second transistors having a second threshold voltage greater than the first threshold voltage; and
the first gate structures have smaller dimensions than the second gate structures in the first direction.

16. The semiconductor structure of claim 14, wherein the third regions of the nanowires have smaller dimensions than the first regions or the second regions of the nanowires in the second direction.

17. The semiconductor structure of claim 14, wherein each of the first gate structures, the second gate structures, and the source/drains circumferentially wraps around a respective one of the first, second, and third regions of the nanowires in 360 degrees.

18. The semiconductor structure of claim 14, further comprising a plurality of third gate structures disposed over an uppermost one of the nanowires, wherein:
the third gate structures have different dimensions than the first gate structures or the second gate structures in the second direction; and
gate spacers are disposed on sidewalls of the third gate structures but not on sidewalls of the first gate structures or on sidewalls of the second gate structures.

19. The semiconductor structure of claim 18, wherein:
the first direction is a horizontal direction;
the second direction is a vertical direction;
the first gate structures are vertically aligned with a first subset of the third gate structures; and
the second gate structures are vertically aligned with a second subset of the third gate structures.

20. A semiconductor structure, comprising:
a nanowire stack that includes a plurality of nanowires, wherein the nanowires each spans along a first direction, and wherein the nanowires are spaced apart from one another in a second direction different from the first direction;

a plurality of first gate structures and a plurality of second gate structures, wherein each of the nanowires is wrapped around circumferentially by the first gate structures and by the second gate structures, and wherein the second gate structures have larger dimensions than the first gate structures in the second direction; and a plurality of third gate structures disposed over the nanowire stack, wherein the third gate structures and the second gate structures have unequal dimensions in the second direction.

* * * * *